(12) United States Patent
Fang et al.

(10) Patent No.: US 12,557,495 B2
(45) Date of Patent: Feb. 17, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fei Fang, Beijing (CN); Ke Liu, Beijing (CN); Ling Shi, Beijing (CN); Xuewei Tian, Beijing (CN); Hui Lu, Beijing (CN); Shuai Xie, Beijing (CN); Dan Guo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 594 days.

(21) Appl. No.: 17/925,503

(22) PCT Filed: Dec. 27, 2021

(86) PCT No.: PCT/CN2021/141588
§ 371 (c)(1),
(2) Date: Nov. 15, 2022

(87) PCT Pub. No.: WO2023/122874
PCT Pub. Date: Jul. 6, 2023

(65) Prior Publication Data
US 2024/0237433 A1 Jul. 11, 2024

(51) Int. Cl.
*H10K 59/131* (2023.01)

(52) U.S. Cl.
CPC ................ *H10K 59/131* (2023.02)

(58) Field of Classification Search
CPC ................................... H10K 59/131
See application file for complete search history.

(56) References Cited

U.S. PATENT DOCUMENTS

2020/0194730 A1* 6/2020 Park ............ H10K 59/1213
2020/0212121 A1  7/2020 Kang

FOREIGN PATENT DOCUMENTS

| CN | 110265448 A |   | 9/2019 |  |
|---|---|---|---|---|
| CN | 111445847 A |   | 7/2020 |  |
| CN | 111710239 A |   | 9/2020 |  |
| CN | 112133250 A | * | 12/2020 | ........ G09G 3/3208 |

* cited by examiner

*Primary Examiner* — Robert J Michaud
(74) *Attorney, Agent, or Firm* — IPro, PLLC

(57) ABSTRACT

A display panel includes a base substrate including a display area and a peripheral area surrounding the display area, the display area comprises a first display area and a second display area, the first display area at least partially surrounds the second display area; a plurality of first/second pixel circuits located in the first/second display area; a plurality of first initialization signal lines, located at least in the first display area and extending in a first direction, being electrically connected to the first pixel circuit and configured to transmit a first initial voltage signal to the first pixel circuit; a plurality of second initialization signal lines, located at least in the first display area and the second display area, and electrically connected to the second pixel circuit, configured to transmit a second initial voltage signal to the second pixel circuit; the first and second initial voltage signals being different.

19 Claims, 12 Drawing Sheets

DISPLAY PANEL AND DISPLAY DEVICE

This application is the U.S. national phase of PCT Application No. PCT/CN2021/141588 filed on Dec. 27, 2021, which is incorporated herein by reference in its entirety.

TECHNICAL FIELD

The present disclosure relates to the field of display technology, in particular to a display panel and a display device.

BACKGROUND

With the increasing application requirements of display screens, especially mobile phone display screens, setting a camera module under the screen has become the current development trend of display panels.

For the display panel where the camera module is set under the screen, the corresponding display area of the camera module under the screen can display the image on the display panel when it is in the display state, and the entire display panel has a full-screen display effect; when the camera module under the screen is not in the display state, the corresponding display area of the camera module under the screen can be transparent, so as to allow the outside ambient light to pass through, which is used for image collection of the camera module.

In the related art, there is a display difference between the corresponding display area of the camera module under the screen and the normal display area, and there is a problem of uneven brightness.

SUMMARY

The solution of the present disclosure aims to provide a display panel and display device, so as to solve the technical problem in the related art that there is a display difference between the corresponding display area of the camera module under the screen and the normal display area.

An embodiment of the present disclosure provides a display panel including a base substrate, wherein the base substrate comprises a display area and a peripheral area at least partially surrounding the display area, the display area comprises a first display area and a second display area, the first display area at least partially surrounds the second display area; a plurality of first pixel circuits located in the first display area; a plurality of second pixel circuits located in the second display area; a plurality of first initialization signal lines, located at least in the first display area and extending in a first direction, the first initialization signal lines being electrically connected to the first pixel circuit and configured to transmit a first initial voltage signal to the first pixel circuit; a plurality of second initialization signal lines, located at least in the first display area and the second display area, and electrically connected to the second pixel circuit, configured to transmit a second initial voltage signal to the second pixel circuit; the first initial voltage signal and the second initial voltage signal being different.

Optionally, a voltage of the first initial voltage signal is higher than a voltage of the second initial voltage signal.

Optionally, the second initialization signal line comprises a first part located in the first display area and a second part located in the second display area, the second part is connected to the second pixel circuit.

Optionally, the display panel further comprises a third initialization signal line; the third initialization signal line at least partially surrounds the second pixel circuit, and the plurality of first initialization signal lines is connected to the third initialization signal line.

Optionally, the third initialization signal line and a first part of the second initialization signal line located in the first display area are arranged at a same layer, and the plurality of first initialization signal lines and a second part of the second initialization signal line located in the second display area are arranged at a same layer, the first part and the second part are electrically connected to each other and arranged at different layers.

Optionally, the third initialization signal line is located in the first display area or the second display area, and the third initialization signal line is in a closed ring shape.

Optionally, the display panel further comprises a first initialization bus and a second initialization bus located in the peripheral area, the plurality of first initialization signal lines is connected to the first initialization bus, and the plurality of second initialization signal lines is connected to the second initialization bus.

Optionally, the first initialization bus is located on a side of the second initialization bus away from the base substrate.

Optionally, the first initialization bus comprises a first sub-line and a second sub-line; the first sub-line and the second sub-line are located on both sides of the display area; the second initialization bus includes a third sub-line and a fourth sub-line, and the third sub-line and the fourth sub-line are located on both sides of the display area.

Optionally, the plurality of first pixel circuits comprise a plurality of first pixel groups, and the plurality of second pixel circuits comprise a plurality of second pixel groups; different first pixel groups are connected to different first initialization signal lines in the first display area; different second pixel groups are connected to different second initialization signal lines in the second display area.

Optionally, a plurality of first pixel circuits located in the same first pixel group are sequentially arranged in a straight line along the first direction; a plurality of second pixel circuits located in the same second pixel group are staggered along the second direction.

Optionally, in the first display area, at least part of the plurality of first initialization signal lines and at least part of the plurality of second initialization signal lines are alternately arranged along the second direction; the second direction intersects the first direction.

Optionally, a plurality of the first pixel circuits and a plurality of the second pixel circuits respectively comprise thin film transistors arranged on the base substrate, the thin film transistor comprises an active layer, a gate electrode and a source/drain electrode that are sequentially arranged in a direction away from the base substrate; the display panel further includes a light shielding layer arranged between the base substrate and the active layer; wherein, the plurality of first initialization signal lines, the second part and the gate electrode are arranged at a same layer and made of a same material; the third initialization signal line, the first part, and the active layer are arranged at a same layer and made of a same material; or, the third initialization signal line, the first part, and the light shielding layer are arranged at a same layer and made of a same material; or, the third initialization signal line, the first part and the source-drain layer are arranged at a same layer and made of a same material.

Optionally, the first part and the second part are electrically connected through a first connection layer, and the plurality of first initialization signal lines and the third initialization signal line are electrically connected through a second connection layer; the first connection layer and the second connection layer are arranged at a same layer and made of a same material.

Optionally, the first connection layer, the second connection layer and the source/drain electrodes are arranged at a same layer and made of a same material.

Optionally, the plurality of first initialization signal lines and the plurality of second initialization signal lines are respectively electrically connected to a source/drain electrode of a thin film transistor.

Optionally, the second display area is a light transmitting display area, and a density of the plurality of second pixel circuits in the second display area is less than or equal to a density of the plurality of first pixel circuits in the first display area.

Optionally, the display area further comprises a plurality of auxiliary signal lines, located in the first display area and extending along a first direction; the plurality of auxiliary signal lines are not connected to any one of the first pixel circuits and any one of the second pixel circuits.

Optionally, the auxiliary signal line and a part of the second initialization signal line are arranged at a same layer and made of a same material.

An embodiment of the present disclosure provides a display device includes the driving circuit.

BRIEF DESCRIPTION OF THE DRAWINGS

In order to more clearly illustrate the technical solutions in the embodiments of the present disclosure or related art, the following briefly introduces the accompanying drawings used in the embodiments. Obviously, the drawings are only for some embodiments of the present disclosure, and for those of ordinary skill in the art, other drawings can also be obtained from these drawings without any creative work.

DETAILED DESCRIPTION

In order to make the technical problems, technical solutions and advantages to be solved by the present disclosure more clear, detailed description will be given below with reference to the accompanying drawings and specific embodiments.

In order to solve the problem of display difference between the display area set corresponding to the camera module under screen and the normal display area due to the compression of the pixel circuit in the display panel provided with the camera module under the screen in the related art, an embodiment of the present disclosure provides a display panel, the pixel circuits set in the normal display area and the pixel circuits set in the display area corresponding to the camera module under the screen are connected to different initialization signal lines, so that the pixel circuits can be reset by using different initialization signal lines, so as to ensure the consistency of switching of the driving units of different pixel circuits and avoid the problem of display differences in different areas.

Figure 1:
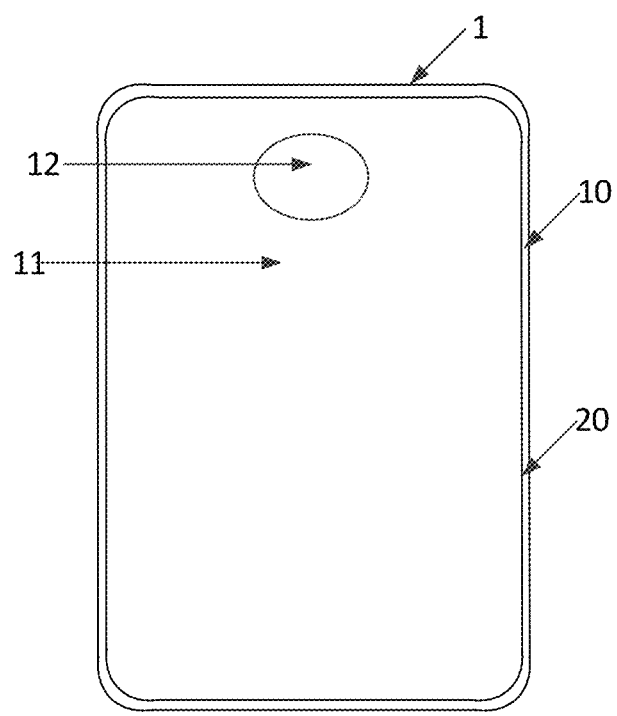
FIG. 1 is a schematic plan view of a display panel according to an embodiment of the disclosure.

The display panel according to the embodiment of the present disclosure includes a base substrate. As shown in FIG. 1, the base substrate 1 includes a display area 10 and a peripheral area 20 at least partially surrounding the display area 10, and the display area 10 includes a first display area 11 and a second display area 12 adjacent to each other, wherein the arrangement structure of the first display area 11 and the second display area 12 may be as shown in FIG. 1.

Optionally, the second display area 12 is formed as a light-transmitting display area. When the display panel is installed on the electronic device, a photosensitive element such as a camera or a sensor can be installed on a position corresponding to the second display area 11 in the electronic device, images are collected through the second display area 12 to form an under-screen camera display structure.

Optionally, the first display area 11 is a normal display area used by the display panel to display images, the first display area 11 is at least partially arranged around the second display area 12, and the first display area 11 and the second display area 12 are combined to form the entire display area of the display panel. In an embodiment, the entire display area of the display panel may be a light-transmitting display area, or only the second display area 12 may be a light-transmitting display area of the display panel, which is used for image collection by the nder-screen camera. Optionally, the display panel is an OLED display panel.

Figure 2:
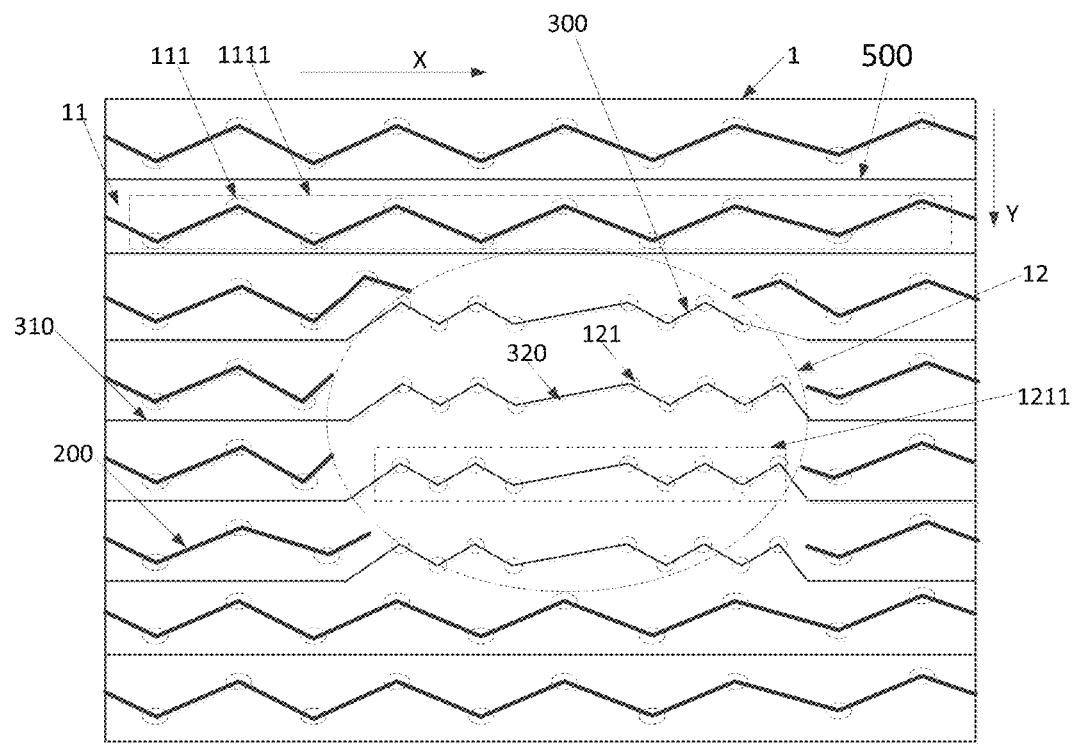
FIG. 2 is a schematic diagram of the arrangement of the first initialization signal line and the second initialization signal line in the display panel according to the embodiment of the present disclosure.
Figure 3:
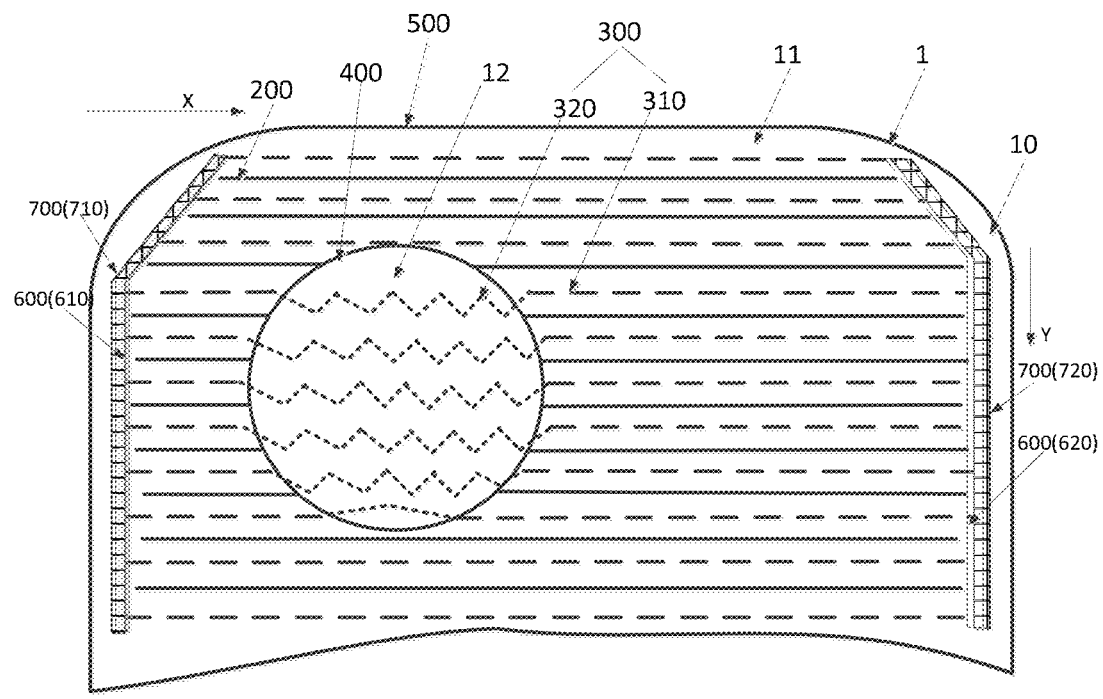
FIG. 3 is another schematic diagram of the arrangement of the first initialization signal line and the second initialization signal line in the display panel according to the embodiment of the present disclosure.

In the display panel according to the embodiment of the present disclosure, a plurality of pixel circuits are respectively arranged on the base substrate 1. As shown in FIGS. 2 and 3, the first display area 11 is provided with a plurality of first pixel circuits 111, and the second display area 12 is provided with a plurality of second pixel circuits 121, wherein a density of the plurality of second pixel circuits 121 in the second display area 12 and a density of the plurality of first pixel circuits 111 in the first display area 11 are the same or different, for example, the density of the plurality of second pixel circuits 121 in the second display area 12 is less than or equal to the density of the plurality of first pixel circuits 111 in a display area 11. Of course, the density of the plurality of second pixel circuits 121 in the second display area 12 may also be greater than the density of the plurality of first pixel circuits 111 in the first display area 11.

Figure 4:
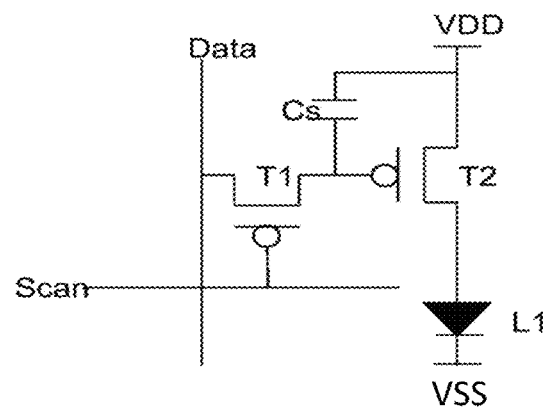
FIG. 4 is a schematic diagram of a structure of a pixel circuit according to an embodiment of the present disclosure.
Figure 5:
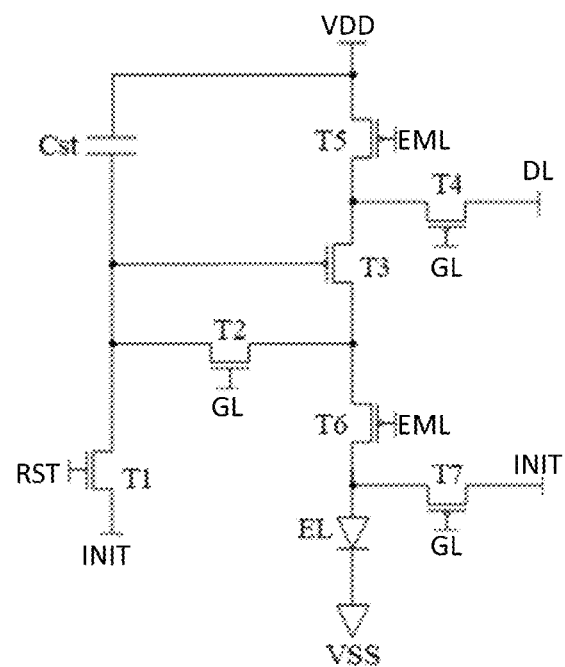
FIG. 5 is another schematic diagram of a structure of a pixel circuit according to an embodiment of the present disclosure.

Optionally, when the density of the plurality of second pixel circuits 121 in the second display area 12 is smaller than the density of the plurality of first pixel circuits 111 in the first display area 11, by reducing the pixel distribution density of the second display area 12, the light transmittance of the second display area 12 can be improved to meet the image collection requirements of the under-screen camera. As shown in FIGS. 2 and 3, in the embodiment of the present disclosure, a plurality of first pixel circuits 111 provided in the first display area 11 and a plurality of second pixel circuits 121 provided in the second display area 12 are distributed in an array on the base substrate 1, respectively. Optionally, the plurality of first pixel circuits 111 and the plurality of second pixel circuits 121 respectively include driving units and light emitting units that are sequentially arranged on the base substrate 1. Wherein, in the direction perpendicular to the base substrate 1, one driving unit corresponds to one light emitting unit. In the embodiment of the present disclosure, the driving unit refers to a structure unit including thin film transistors, capacitors, and other auxiliary transistors that can drive the corresponding light emitting unit to emit light. The circuit principle structure of the driving unit may be as shown in FIG. 4, which is formed as a 2T1C pixel driving circuit, which can also be a 7T1C circuit as shown in FIG. 5, and of course which can also be a circuit with other structures, such as an 8T1C circuit, etc. The specific implementation structure of the driving unit is not limited here.

Figure 6:
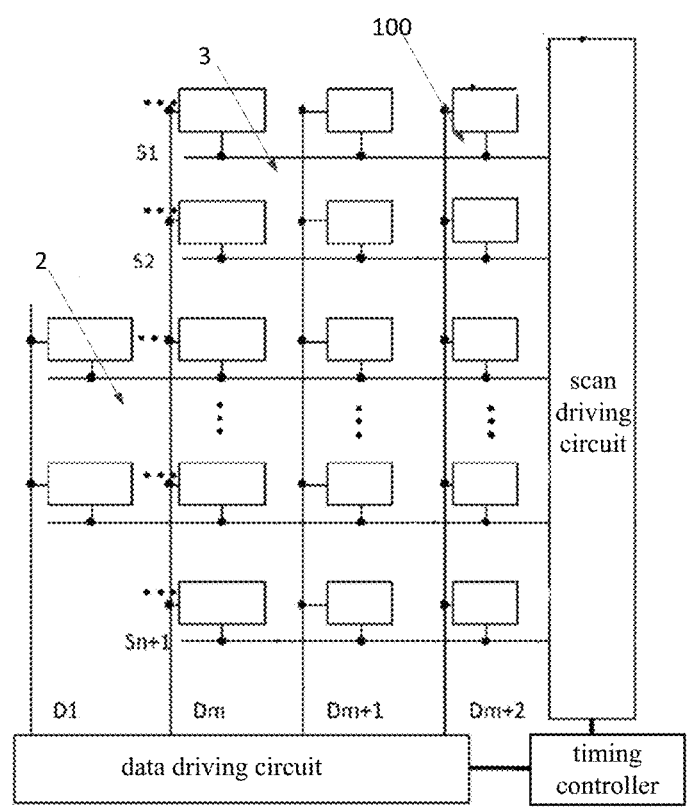
FIG. 6 is yet another schematic diagram of a structure of a pixel circuit according to an embodiment of the present disclosure.

Referring to FIG. 6 and in conjunction with FIGS. 2 to 5, a plurality of gate lines 2 and a plurality of data lines 3 are further provided in the first display area 11 and the second display area 12 of the base substrate 1, wherein the plurality of gate lines 2 and the plurality of data lines 3 are insulated and intersected to define a plurality of array areas, each array area is correspondingly provided with a first pixel circuit or a second pixel circuit, and each array area is respectively provided with a driving unit. Among them, a plurality of driving units located in the same pixel row are respectively connected to a gate line 2, and a plurality of driving units located in the same pixel column are respectively connected to a data line 3, and each gate line 2 is respectively connected to a scan driving circuit. The scan signal Scan is inputted to each gate line 2 through the scan driving circuit, and the data signal Data is inputted to each data line 3 through the data driving circuit.

As shown in FIGS. 4 and 6, taking the driving unit formed as a 2T1C pixel driving circuit as an example, the gate line 2 and the data line 3 are connected to the first transistor T1 of the driving unit, the first transistor T1 is connected to the second transistor T2, and the second transistor T2 is connected to the light emitting unit L1.

Specifically, each gate line 2 is respectively connected to a scan driving circuit, the scan driving circuit outputs a scan signal Scan to the control end of the first transistor T1 through the gate line 2, and each data line 3 is connected to the data driving circuit, and the data driving circuit outputs the data signal Data to the first end of the first transistor T1 through the data line 3, and the second end of the first transistor T1 is respectively connected to the control end of the second transistor T2 and the first end of the first capacitor Cs; the second end of the first capacitor Cs is connected to the first end of the second transistor T2 and connected to the first power supply signal VDD, the second end of the second transistor T2 is connected to the anode of the light emitting unit L1, and the cathode of the light emitting unit L1 is connected to the second power supply signal VSS. With this structure, by the scan signal Scan outputted by the scan driving circuit to the control end of the first transistor T1 through the gate line 2 in a time division manner, the data signal Data outputted by the data driving circuit through the data line 3 is inputted to the control end of the second transistor T2, to control the light emitting unit L1 to emit light according to a preset timing.

As shown in FIG. 4, in the driving unit, the first end of the driving transistor (the second transistor T2) that drives the light emitting unit L1 to emit light is connected to the first power supply signal VDD, the cathode of the light emitting unit L1 is connected to the second power supply signal VSS, and the first power supply signal VDD and the second power supply signal VSS are respectively used to provide a constant voltage signal, and the voltage of the first power supply signal VDD is greater than the voltage of the second voltage signal, so that the voltage difference between the first power supply signal VDD and the second power supply signal VSS is utilized for the light emitting unit L1 to emit light. Optionally, on the entire display panel, in the plurality of driving units located in the same pixel row, the first power supply signal VDD is connected through one signal line, and the second power supply signal VSS is connected through another signal line, so that the first power supply signal VDD and the second power supply signal VSS can be inputted to the plurality of driving units on the same pixel row. As shown in FIGS. 2 and 3, in the embodiment of the present disclosure, a plurality of initialization signal lines are further provided on the base substrate 1, and the initialization signal lines are connected to the driving units of the display area, and are used to input the initial voltage signal the driving units.

As shown in FIGS. 5 and 6, when the driving unit is formed as a 7T1C pixel driving circuit, the pixel driving circuit includes a first transistor T1 to a seventh transistor T7 and a first capacitor Cs; wherein, the pixel driving circuit is connected to the scan line GL, the data line DL, the first power supply signal VDD, the second power supply signal VSS, the light emitting control line EML, the reset control line RST, and the initial signal line INIT. The scan line GL corresponds to the gate line 2 in FIG. 6, and is used to provide the scan signal SCAN to the pixel circuit; the data line DL corresponds to the data line 3 of FIG. 6, is used to provide the pixel circuit with the data signal DATA, and the light emitting control line EML is used to provide the reset control signal RESET to the pixel circuit; the first power supply signal VDD and the second power supply signal VSS are respectively used to provide a constant voltage signal, and a voltage of the first power supply signal VDD is greater than a voltage of the second voltage signal.

In the pixel circuit of this embodiment, the third transistor T3 is formed as a driving transistor of the light emitting unit EL, the first transistor T1, the second transistor T2, the fourth transistor T4, the fifth transistor T5, the sixth transistor T6 and the seventh transistor T7 are respectively formed as switch transistors, and use different signal inputs of the scan line GL, data line DL, light emitting control line EML, reset control line RST and initial signal line INIT to control the light emitting unit EL to emit light according to the preset timing to realize image display.

As shown FIGS. 1, 2 and 3, in the embodiment of the present disclosure, the base substrate 1 includes a first display area 11 and a second display area 12, and when the density of a plurality of second pixel circuits 121 arranged in the second display area 12 is less than or equal to the density of the plurality of first pixel circuits 111 arranged in the first display area 11, in order to meet the density requirements of the plurality of second pixel circuits 121 arranged in the second display area 12 and the light transmittance requirements of the second display area 12, an area of one second pixel circuit 121 on the second display area 12 is less than or equal to an area of one first pixel circuit 111 on the first display area 11, as compared with the first display area 11, the pixel circuit of the second display area 12 is compressed. As shown in FIG. 4 and FIG. 5, the compression of the pixel circuit on the second display area 12 will decrease the first capacitor Cs (that is, the storage capacitor Cst), so that the stability of the pixel circuit is deteriorated, and the switching degree of the thin film transistor is reduced, so that the display effects of the first display area 11 and the second display area 12 are different.

Figure 7:
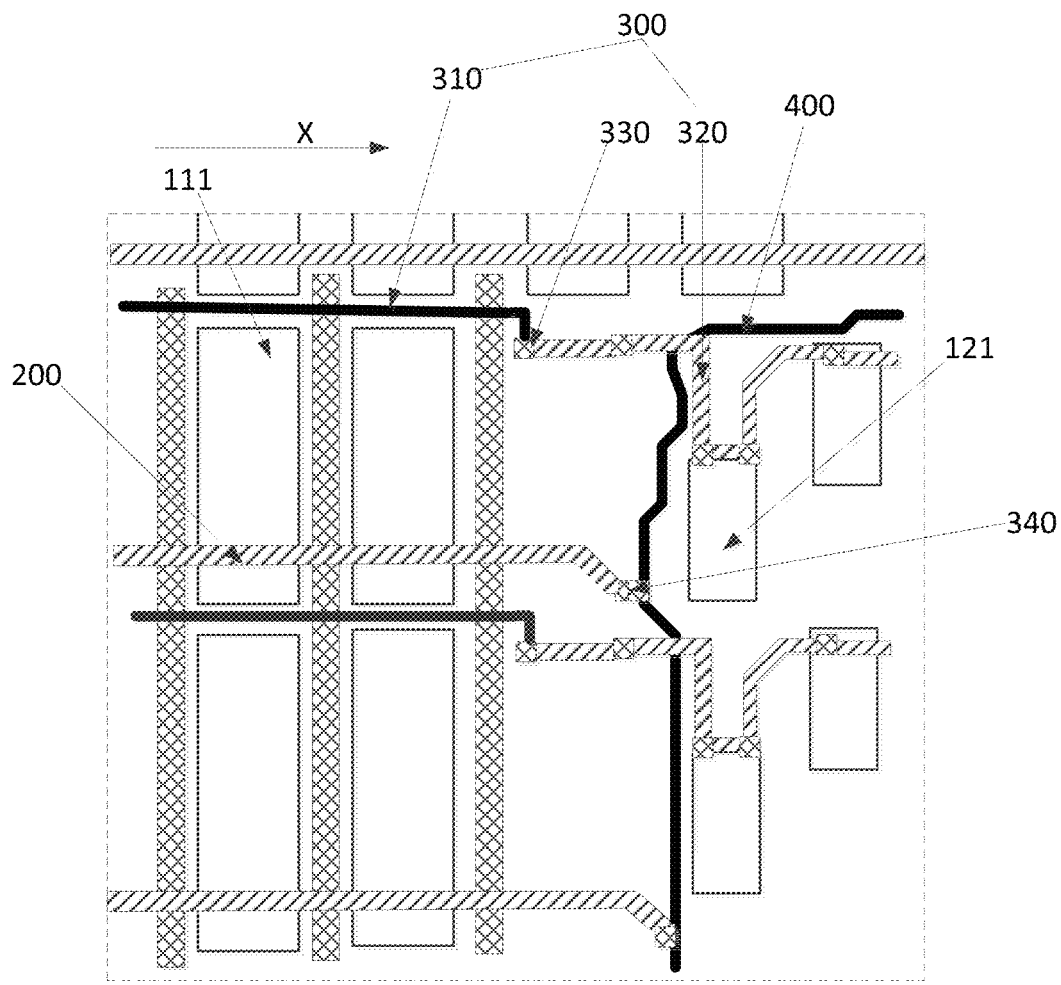
FIG. 7 is a schematic diagram of an enlarged structure of a display panel according to an embodiment of the present disclosure.

In order to solve this technical problem, in the display panel according to the embodiment of the present disclosure, as shown in FIG. 2, FIG. 3 and FIG. 7, the base substrate 1 is further provided with:

a plurality of first initialization signal lines 200, located at least in the first display area 11 and extend along a first direction (X direction in FIG. 2); wherein, the first initialization signal lines 200 are connected to the first pixel circuit 111 and are configured to transmit a first initial voltage signal to the first pixel circuit 111;

a plurality of second initialization signal lines 300, located at least in the first display area 11 and the second display area 12, and electrically connected to the second pixel circuit 121, configured to transmit a second initial voltage signal to the second pixel circuit 121;

Wherein, the first initial voltage signal and the second initial voltage signal are different.

In the embodiment of the present disclosure, the first initialization signal line 200 for inputting the initial voltage signals of the plurality of first pixel circuits 111 in the first display area 11 and the second initialization signal line 300 for inputting the initial voltage signals of the plurality of second pixel circuits 121 in the second display area 12 are separately arranged and different initial voltage signals are inputted to provide different initial voltage signals to the first pixel circuit 111 in the first display area 11 and the second pixel circuit 121 in the second display area 12, optionally, the voltage of the first initial voltage signal inputted to the first initialization signal line is higher than the voltage of the second initial voltage signal inputted to the second initialization signal line, so as to correct the different display effects of the first display area 11 and the second display area 12.

In the embodiment of the present disclosure, optionally, the first initialization signal line 200 and the second initialization signal line 300 are capable of inputting a stable voltage signal to the pixel circuit connected thereto, and the first initialization signal line 200 and the second initialization signal line 300 are connected different pixel circuits. Optionally, they may be a signal line for inputting an initialization voltage; in another embodiment, they may also be a signal line for inputting a constant voltage.

In the embodiment of the present disclosure, optionally, as shown in FIG. 3 and FIG. 7, the display panel further includes a third initialization signal line 400, wherein the third initialization signal line 400 at least partially surrounds the second pixel circuit 121, and the plurality of first initialization signal lines 200 is connected to the third initialization signal line 400.

Referring to FIG. 3, the plurality of first initialization signal lines 200 respectively extend from the first edge of the base substrate 1 to the second edge of the base substrate 1 along the first direction X, and the second edge is opposite to the first edge. In the embodiment of the present disclosure, the third initialization signal line 400 surrounds the second pixel circuit 121, so that when the first initialization signal line 200 extends to the edge of the second display area 12 along the first direction X, the first initialization signal line 200 is connected the third initialization signal line 400, and further extends toward the second edge of the base substrate 1, so as to be able to connect with a greater number of first pixel circuits 111 between the first edge and the second edge, so as to achieve the effect of simplifying the circuit and the production process.

Optionally, in the embodiment of the present disclosure, as shown in FIG. 3, among the plurality of first initialization signal lines 200 arranged on the first display area 11, the plurality of first initialization signal lines 200 extending along the first direction X to the edge of the second display area 12 are respectively connected to the third initialization signal lines 400.

Optionally, the third initialization signal line 400 is located in the first display area 11 or the second display area 12, and the third initialization signal line 400 located in the first display area 11 or the second display area 12 surrounds all the second pixel circuits 121. In one embodiment, as shown in FIG. 2 and FIG. 3, when the first display area 11 surrounds the second display area 12, the third initial signal line 400 surrounds the edge of the second display area 12 to enclose all the second pixel circuit 121 and a closed loop is formed.

In this embodiment, optionally, a plurality of first initialization signal lines 200 are respectively arranged on opposite sides of the third initialization signal line 400.

Based on the third initialization signal lines 400, as shown in FIG. 2, FIG. 3 and FIG. 7, when the plurality of second initialization signal lines 300 extend from the first edge of the base substrate 1 to the opposite second edge in the first direction X on the base substrate 1, the plurality of second initialization signal lines 300 are divided into at least two parts by the third initialization signal line 400, including the first part 310 located in the first display area 11 and the second part 320 located in the second display area 12; wherein, the second part 320 is connected to the second pixel circuit 121.

Optionally, as shown in FIG. 3 and FIG. 7, the first display area 11 surrounds the second display area 12, and the third initial signal line 400 surrounds the edge of the second display area 12 to form a closed ring structure, each second initialization signal line 300 respectively includes a second part 320 and a first part 310 located on both sides of the second part 320, and is connected to the second pixel circuit 121 through the second port 320.

In this embodiment of the present disclosure, optionally, as shown in FIG. 2, the plurality of first pixel circuits 111 include a plurality of first pixel groups 1111, and the plurality of second pixel circuits 121 include a plurality of second pixel groups 1211;

Wherein, different first pixel groups 1111 are connected to different first initialization signal lines 200 in the first display area 11; different second pixel groups 1211 are connected to different second initialization signal lines 300 in the second display area 12.

In the embodiment of the present disclosure, a plurality of first pixel circuits 111 located in the first display area 11 and connected to the same first initialization signal line 200 may be formed into one first pixel group 1111, and as shown in FIG. 2, a plurality of first pixel circuits 111 in one first pixel group 1111 can be formed in a structure arranged along the first direction X, but is not limited to being arranged in a straight line, and adjacent first pixel circuits 111 can also be arranged in a staggered manner. In the second display area 12, a plurality of second pixel circuits 121 connected to the same second initialization signal line 300 can be formed as one second pixel group 1211, and the plurality of second pixel circuits 121 in the one second pixel group 1211 can also be formed as a structure arranged along the first direction X, but is not limited to being arranged in a straight line, and adjacent second pixel circuits 121 may be arranged in a staggered manner.

In the display panel according to the embodiment of the present disclosure, optionally, as shown in FIG. 2, FIG. 3, and FIG. 7, in the first display area 11, at least part of the plurality of first initialization signal lines 200 and at least part of the plurality of second initialization signal lines 300 are alternately arranged along the second direction Y; the second direction Y intersects the first direction X.

Optionally, the second direction Y is perpendicular to the first direction X.

As shown in FIG. 2 and FIG. 3, optionally, an auxiliary signal line 500 is further arranged between two adjacent first initialization signal lines 200 in a part of the first display area 11, wherein the auxiliary signal line 500 is located between two adjacent first pixel groups in the first display area 11, and is not connected to any of the first pixel circuits 111, nor connected to any of the second pixel circuits 121. In this embodiment, a plurality of second initialization signal lines 300 are arranged on a first part of the first display area 11 located on both sides of the second display area 12 on the base substrate 1, and are connected to the second pixel circuit 121 in the second display area 12; a plurality of auxiliary signal lines 500 are arranged on a second part of the first display area 11 except the first part, which are not connected to any first pixel circuit 111 and any second pixel circuit 121, and the extending direction is parallel to the first initialization signal line 200, and is formed by the same patterning process as the second initialization signal line 300, so as to achieve the effect of simplifying the manufacture process.

In the embodiment of the present disclosure, optionally, the third initialization signal line 400 and the first part 310 of the second initialization signal line 300 located in the first display area 11 are arranged at the same layer, and the plurality of first initialization signal lines 200 and the second part 320 of the second initialization signal lines 300 in the second display area 12 are arranged at the same layer, and the first part 310 and the second part 320 are electrically connected and are arranged at different layers.

Figure 8:
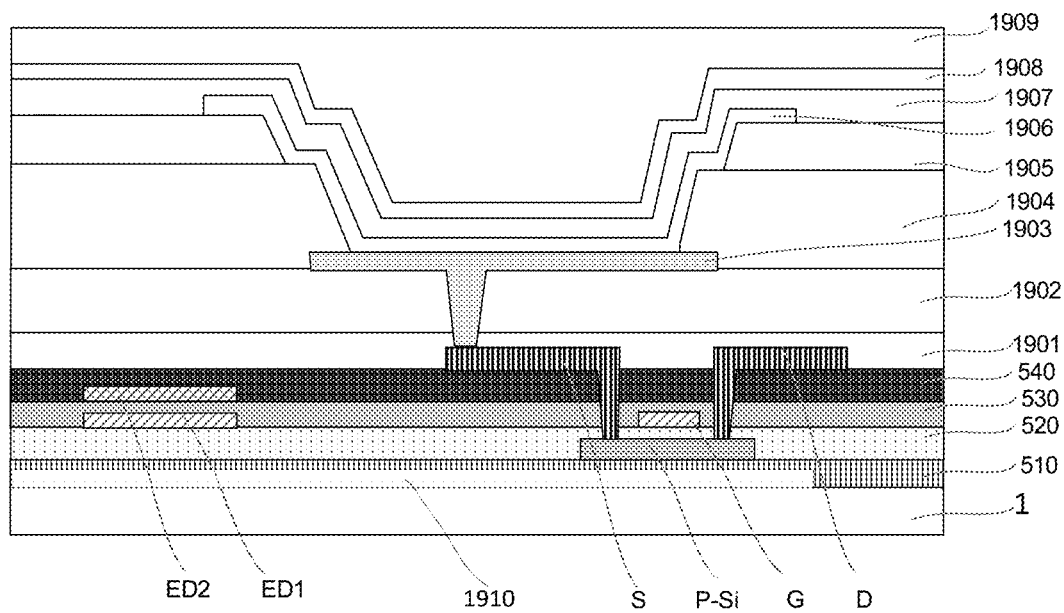
FIG. 8 is a schematic cross-sectional diagram of a structure of a pixel circuit of a display panel according to an embodiment of the disclosure.

As shown in FIGS. 7 and 8, the connection structure of the first initialization signal line 200 and the second initialization signal line 300 and the pixel circuit on the display panel in the display panel according to the embodiment of the present disclosure will be illustrated as an example.

Taking the display panel as a top emission OLED display panel as an example, as shown in FIG. 8 and FIG. 10, and in conjunction with FIG. 2, FIG. 3 and FIG. 4, in the first display area 11 and the second display area 12, the first pixel circuit 111 and the second pixel circuit 121 respectively include a thin film transistor, a light emitting element and a capacitor, the thin film transistor has a gate electrode G, a source electrode S and a drain electrode D; the first capacitor Cs includes a first electrode ED1 and a second electrode ED2. The active layer P-Si of the thin film transistor is located between the buffer layer 510 and the first gate insulating layer 520, and is connected to the source electrode S and the drain electrode D. The interlayer insulating layer 540 is located between the gate electrode G and the source electrode S and drain electrode D. The first gate insulating layer 520 is located on the side of the interlayer insulating layer 540 facing the base substrate 110. The second gate insulating layer 530 is located between the interlayer insulating layer 540 and the first gate insulating layer 520. The first electrode ED1 of the capacitor is arranged at the same layer as the gate electrode G of the thin film transistor, and the second electrode ED2 of the capacitor is arranged between the interlayer insulating layer 540 and the second gate insulating layer 530.

Optionally, the first pixel circuit 111 and the second pixel circuit 121 further include a passivation layer 1901, a first planarization layer 1902, a transfer electrode 1903 and a second planarization layer 1904, respectively. The passivation layer 1901 is located on the side of the interlayer dielectric layer 540 away from the base substrate 1. The first planarization layer 1902 is located on the side of the passivation layer 1901 away from the base substrate 1. The transfer electrode 1903 is located on the side of the first planarization layer 1902 away from the base substrate 1, and is connected to the source electrode S of the thin film transistor through a via hole in the first planarization layer 1902 and the passivation layer 1901. The second planarization layer 1904 is arranged at the side of the transfer electrode 1903 away from the base substrate 1 and at least partially covers the transfer electrode 1903.

The light emitting element includes an anode 1906, a light emitting layer 1907 and a cathode 1908. The pixel defining layer 1905 is located on the side of the second planarization layer 1904 away from the base substrate 1. The anode 1906 is located on the side of the transfer electrode 1903 away from the base substrate 1 and is connected to the transfer electrode 1903. The light emitting layer 1907 is located on the side of the anode 1906 away from the base substrate 1 and partially covers the anode 1906. The cathode 1908 is located on the side of the light emitting layer 1907 away from the base substrate 1.

Optionally, the first pixel circuit 111 and the second pixel circuit 121 may further include an encapsulation layer 1909, respectively, are located on the side of the cathode 1908 away from the base substrate 1. In some embodiments, the encapsulation layer 1909 may include a first inorganic encapsulation layer, an organic encapsulation layer, and a second inorganic encapsulation layer stacked in sequence.

In one embodiment, optionally, the first pixel circuit 111 and the second pixel circuit 121 may further include a light shielding layer 1910, which is located between the base substrate 1 and the active layer P-Si, and the light shielding layer 1910 is located on the light emitting layer 1907. An orthographic projection of the light shielding layer 1910 on a plane where the light emitting layer 1907 is located can cover the light emitting layer, so as to prevent light from being transmitted from one side of the base substrate 1.

In the embodiment of the present disclosure, optionally, the third initialization signal line 400 and the first part 310 of the second initialization signal line 300 are arranged at the same layer and made of the same material as the active layer P-Si, the light shielding layer 1910 or the source electrode S-drain electrode D. The first initialization signal line 200 and the second part 320 of the second initialization signal line 300 and the gate electrode G are arranged at the same layer and made of the same material.

The third initialization signal line 400 and the first part 310 of the second initialization signal line 300 and the light shielding layer 1910 are arranged at the same layer and made of the same material, so that the light shielding layer 1910 can be used as a signal line.

Optionally, the first part 310 and the second part 320 of the second initialization signal line 300 are electrically connected through the first connection layer 330, and the first initialization signal line 200 and the third initialization signal line 400 are electrically connected through the second connection layer 340; the first connection layer 330 and the second connection layer 340 are arranged at the same layer and made of the same material; optionally, the first connection layer 330 and the second connection layer 340 are arranged at the same layer and made of the same material as the source electrode S-drain electrode D, respectively.

Referring to FIG. 8, the third initialization signal line 400 and the first part 310 of the second initialization signal line 300 are arranged at the same layer and made of the same material as the light shielding layer 1910, and the first initialization signal line 200 and the second part 320 of the second initialization signal line 300 are arranged at the same layer and made of the same material as the gate electrode G, optionally, via holes can be formed in the interlayer insulating layer 540, the second gate insulating layer 530 and the first gate insulating layer 520, respectively, so as to expose the third initialization signal line 400 arranged at the same layer as the light shielding layer 1910P-Si and the first initialization signal line 200 arranged at the same layer and made of the same material as the gate electrode G, and the first connection layer arranged at the same layer and made of the same material as the source electrode S-drain electrode D can be connected to the first initialization signal line 200 and the third initialization signal line 400; and via holes are formed in the interlayer dielectric layer 540, the second gate insulating layer 530 and the first gate insulating layer 520, respectively, so as to expose the first part 310 of the second initialization signal line 300 arranged at the same layer and made of the same material as the light shielding layer 1910 and the second part 320 of the second initialization signal line 300 arranged at the same layer and made of the same material as the gate electrode G. The second connection layer arranged at the same layer and made of material as the source electrode S-drain electrode D can connect the first part 310 and the second part 320 of the second initialization signal line 300.

Similarly, when the third initialization signal line 400 and the first part 310 of the second initialization signal line 300 are arranged at the same layer and made of the same material as the light shielding layer 1910 or the source electrode S-drain electrode D, the first initialization signal line 200 and the second part 320 of the second initialization signal line 300 are arranged at the same layer and made of the same material as the gate electrode G, by the formation of the via holes, the first initialization signal line 200 and the third initialization signal line 400 can also be connected through the first connection layer, and the the first part 310 and the second part 320 of the second initialization signal line 300 are connected through the second connection layer, and detailed descriptions for each implementation are omitted here.

In the embodiments of the present disclosure, in one embodiment, as shown in FIG. 5, optionally, the first initialization signal line 200 is used to input an initialization signal to the thin film transistor of the first pixel circuit 111 connected thereto, and the second initialization signal line 300 is used to input an initialization signal to the thin film transistor of the second pixel circuit 121 connected thereto, wherein the first initialization signal line 200 is connected to the source-drain layer of the thin film transistor of the first pixel circuit 111, and the second part of the second initialization signal line 300 is connected to the source-drain layer of the thin film transistor of the second pixel circuit 121. Using the display panel described in this embodiment, the first pixel circuit 111 in the first display area 11 and the second pixel circuit 121 in the second display area 12 are connected to different initialization signal lines, so that different initialization signal lines can be used to reset pixel circuits in different areas. Optionally, a plurality of first initialization signal lines 200 are connected to one voltage source, and a plurality of second initialization signal lines 300 are connected to another voltage source, and different voltage sources provide the initial voltages to the first initialization signal line 200 and the second initialization signal line 300.

It should be noted that, in the embodiment of the present disclosure, the first initialization signal line 200 and the second initialization signal line 300 are not limited to being only the signal lines for providing the initialization voltage. The signal lines for providing stable voltages and connected to the different rows of pixel circuits on the display panel can all adopt the arrangement of the initialization signal lines in this embodiment. For example, the first initialization signal line 200 and the second initialization signal line 300 may be signal lines for inputting the first power supply signal VDD, respectively.

As shown in FIG. 4, for example, when the first initialization signal line 200 and the second initialization signal line 300 are respectively the signal lines for inputting the first power supply signal VDD to the driving transistors of the driving units connected thereto, each first initialization signal line 200 is connected to the first ends of a plurality of driving transistors of one row of pixels on the first display area 11, and are used to input a first power supply signal VDD, such as a first voltage value to the first ends of the driving transistors connected thereto. Each second initialization signal line 300 is respectively connected to the first ends of a plurality of driving transistors of one row of pixels in the second display area 12, and is used to input the first power supply signal VDD, such as is the second voltage value to the first end of the driving transistor; optionally, the first voltage value is different from the second voltage value.

In the display panel according to the embodiment of the present disclosure, the pixel circuit set in the normal display area and the pixel circuit set in the display area corresponding to the camera module under screen are connected to different initialization signal lines respectively, so that different initialization signal lines can be used to reset the voltage of the pixel circuit, to ensure the consistency of switching degrees of the driving units of the pixel circuits in different display areas, and to avoid the problem of display differences in different areas.

Figure 9:
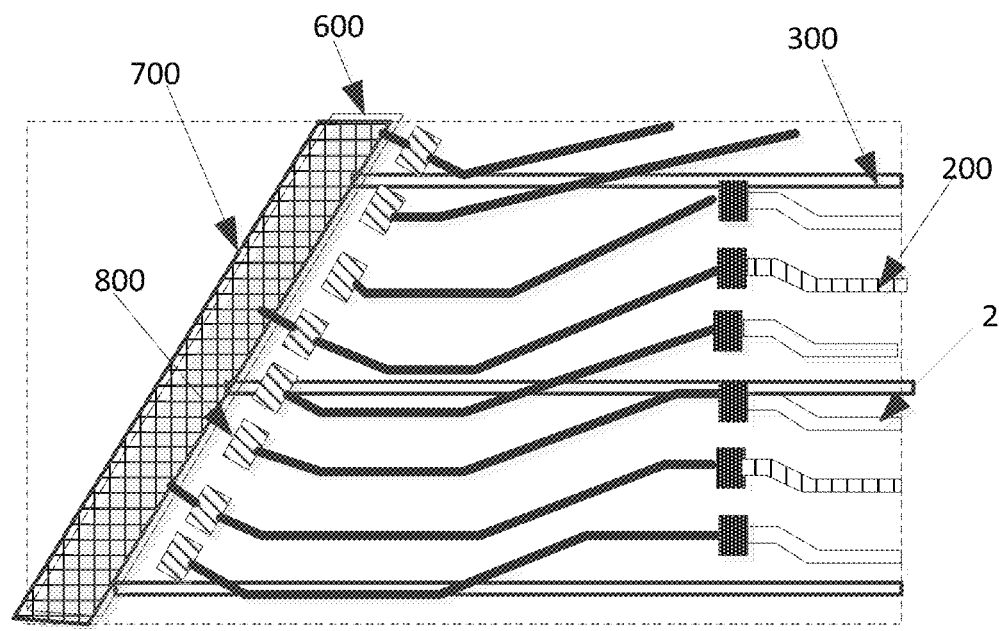
FIG. 9 is a schematic plan view of a partial structure of a peripheral area of a display panel.

The display panel according to the embodiment of the present disclosure, with reference to FIG. 1, FIG. 3 and FIG. 9, the display panel further includes a first initialization bus 600 and a second initialization bus 700 located in the peripheral area 20, wherein a plurality of first initialization signal lines 200 is connected to the first initialization bus 600, and a plurality of second initialization signal lines 300 are connected to the second initialization bus 700, and are used to input different initial voltage signals to the first initialization signal line 200 and the second initialization signal line 300 through the first initialization bus 600 and the second initialization bus 700.

In the embodiment of the present disclosure, as shown in FIG. 3 and FIG. 9, optionally, the first initialization bus 600 is located on a side of the second initialization bus 700 away from the base substrate.

Optionally, in the display panel, the first initialization bus 600 includes a first sub-line 610 and a second sub-line 620; the first sub-line 610 and the second sub-line 620 are respectively located on both sides of the display area;

The second initialization bus 700 includes a third sub-line 710 and a fourth sub-line 720, and the third sub-line 710 and the fourth sub-line 720 are located on both sides of the display area.

In the embodiment of the present disclosure, optionally, in an implementation as shown in FIG. 9, in the peripheral area 200, the first initialization bus 600 includes a plurality of connection ends, and some of the connection ends are connected to the first initialization signal line 200, are used to input a voltage signal to the first initialization signal line 200, and some of the connection end are connected to the gate line 2 and used to input a voltage signal to the gate line.

In this embodiment, the first initialization bus 600 and the second initialization bus 700 are arranged on both sides of the display area, respectively, are connected to the first initialization signal line 200 or the second initialization signal line 300 on both sides of the display area, respectively.

Optionally, as shown in FIG. 9, a plurality of transfer blocks 800 are respectively provided on the inner side of the first initialization bus 600 and the second initialization bus 700, are used to transfer the gate lines or light emitting control lines EML of the pixel circuit.

In the display panel according to the embodiment of the present disclosure, the arrangement of a plurality of second pixel circuits 121 on the second display area 12 can ensure that the resolutions (PPI) of different display areas of the display panel are consistent, and can improve the light transmittance of the light-transmitting display area.

In order to clearly illustrate the structure of the plurality of second pixel circuits 121 on the second display area 12 and the arrangement of the initialization signal lines on the second display area, the structure of the second pixel circuits 121 will be described below with reference to FIGS. 10A to 10I.

In some exemplary embodiments, the second pixel circuit 121 includes: at least one first-type transistor, at least one second-type transistor, and at least one storage capacitor. For example, the second pixel circuit 121 may be an 8T1C (i.e., eight transistors and one capacitor) structure. In a direction perpendicular to the base substrate, the plurality of second pixel circuits 121 on the second display area 12 may include: a first semiconductor layer, a first conductive layer, a second conductive layer, a second semiconductor layer, a third conductive layer and a fourth conductive layer. The first semiconductor layer includes at least: an active layer of the first-type transistor of the second pixel circuit 121. The first conductive layer at least includes: the control electrode of the first-type transistor of the second pixel circuit 121 and the first electrode of the storage capacitor. The second conductive layer at least includes: the second electrode of the storage capacitor of the second pixel circuit 121. The second semiconductor layer includes at least: an active layer of the second-type transistor of the second pixel circuit 121. The third conductive layer at least includes: the control electrode of the second-type transistor of the second pixel circuit 121. The fourth conductive layer includes at least: a plurality of connection electrodes.

In some exemplary embodiments, the second pixel circuit 121 includes a plurality of transistors and at least one storage capacitor. For example, the second pixel circuit 121 may have a 7T1C or 5T1C structure. In a direction perpendicular to the base substrate, the second pixel circuit 121 includes: a first semiconductor layer, a first conductive layer, a second conductive layer and a third conductive layer disposed on the base substrate. The first semiconductor layer includes at least an active layer of a plurality of transistors of the second pixel circuit 121. The first conductive layer at least includes: control electrodes of a plurality of transistors of the second pixel circuit 121 and a first electrode of a storage capacitor. The second conductive layer at least includes: the second electrode of the storage capacitor of the second pixel circuit 121. The third conductive layer includes at least: a plurality of connection electrodes.

Figure 10A:
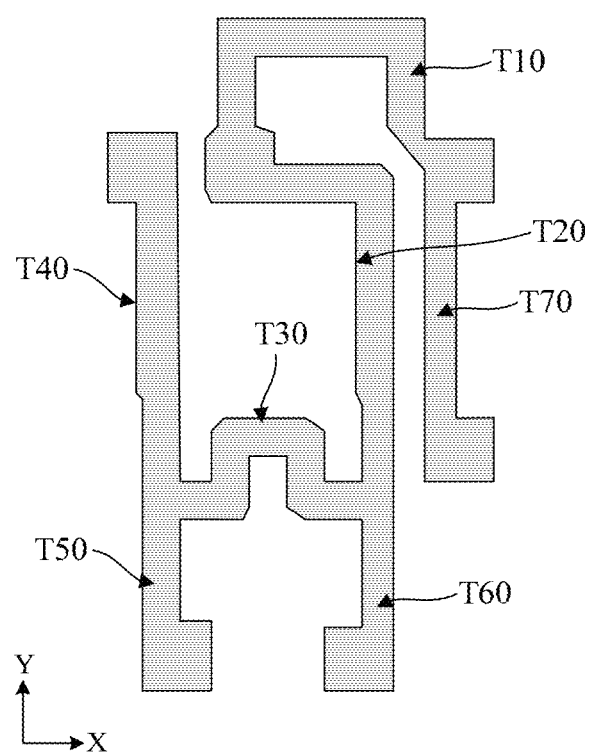
FIGS. 10A to 10H are schematic plan views of the manufacturing process of the second pixel circuit according to an embodiment of the present disclosure.

FIG. 10A is a partial plan view of the first display area after forming the first semiconductor layer according to at least one embodiment of the disclosure. In some exemplary embodiments, as shown in FIG. 10A, the first semiconductor layer of the second display area may include: active layers of a plurality of first-type transistors of the second pixel circuit, for example, the active layer T10 of the first transistor T1, the active layer T20 of the second transistor T2, the active layer T30 of the third transistor T3, the active layer T40 of the fourth transistor T4, the active layer T50 of the fifth transistor T5, and the active layer T60 of the sixth transistor T6, the active layer T70 of the seventh transistor T7. The active layer T10 of the first transistor T1 to the active layer T70 of the seventh transistor T7 of the second pixel circuit may be an integral structure connected to each other.

In some exemplary embodiments, the material of the first semiconductor layer may include polysilicon, for example, the active layer may include at least one channel area and a plurality of doped areas. The channel area may not be doped with impurities and have semiconductor characteristics. A plurality of doped areas may be on both sides of the channel area and are doped with impurities and thus have conductivity. Impurities can vary depending on the type of transistor. In some examples, the doped area of the active layer may be interpreted as a source electrode or a drain electrode of a transistor. The portion of the active layer between the transistors can be interpreted as a wiring doped with impurities, which can be used to electrically connect the transistors.

Figure 10B:
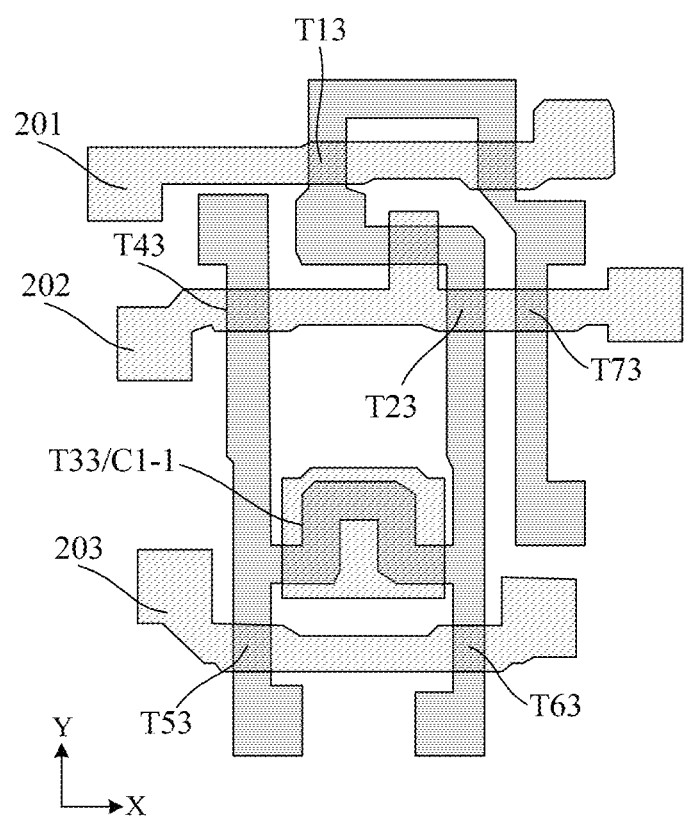

FIG. 10B is a partial plan view of the second display area after forming the first conductive layer according to at least one embodiment of the present disclosure. In some exemplary embodiments, as shown in FIG. 10B, the first conductive layer of the second display area may include: control electrodes of a plurality of first-type transistors of the second pixel circuit (e.g., the control electrode T13 of the first transistor T1, the control electrode T23 of the second transistor T2, the control electrode T33 of the third transistor T3, the control electrode T43 of the fourth transistor T4, the control electrode T53 of the fifth transistor T5, the control electrode T63 of the sixth transistor T6 and the control electrode T73 of the seventh transistor T7), the first electrode C1-1 of the first storage capacitor C1 of the second pixel circuit, the reset connection line 201, the first scan connection line 202, and the light emitting connection line 203. The reset connection line 201, the first scan connection line 202 and the light emitting connection line 203 all extend along the first direction X, and are arranged in sequence along the second direction Y.

In some exemplary embodiments, as shown in FIG. 10B, the first electrode C1-1 of the first storage capacitor C1 and the control electrode T33 of the third transistor T3 may have an integrated structure, for example, may be rectangular. The control electrode T23 of the second transistor T2, the control electrode T43 of the fourth transistor T4, the control electrode T73 of the seventh transistor T7, and the first scan connection line 202 may have an integrated structure. The control electrode T53 of the fifth transistor T5, the control electrode T63 of the sixth transistor T6, and the light emitting connection line 203 may have an integrated structure. The control electrode T13 of the first transistor T1 and the reset connection line 201 may have an integrated structure. However, this embodiment does not limit this.

Figure 10C:
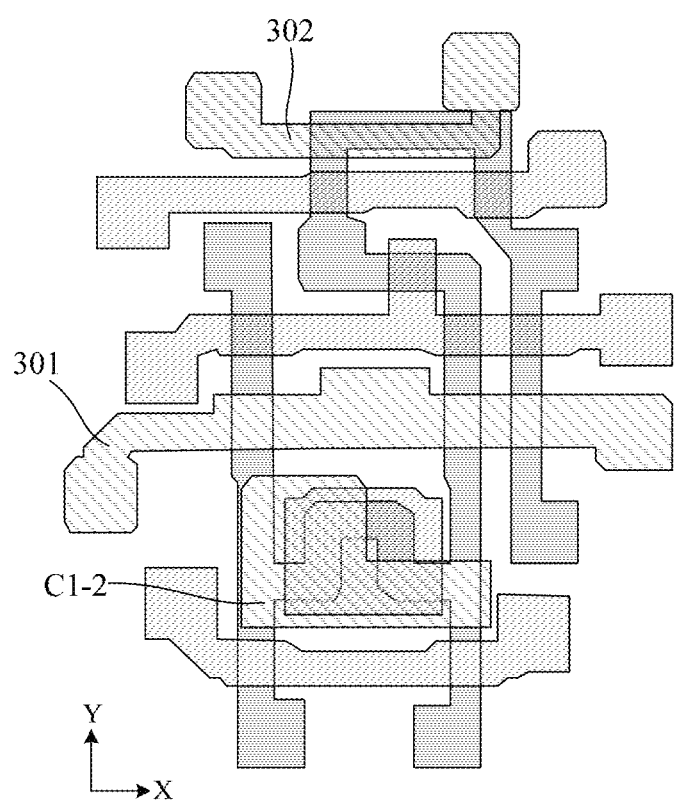

FIG. 10C is a schematic partial plan view of the second display area after forming the second conductive layer according to at least one embodiment of the present disclosure. In some exemplary embodiments, as shown in FIG. 10C, the second conductive layer of the second display area may include: an initial connection line 302, a second scan connection line 301, and a second electrode C1-2 of the first storage capacitor C1. Both the second scan connection line 301 and the initial connection line 302 extend along the first direction X. The orthographic projection of the initial connection line 302 on the base substrate is located on one side of the orthographic projection of the control electrode T13 of the first transistor T1 on the base substrate away from the orthographic projection of the control electrode T23 of the second transistor T2 on the base substrate in the second direction Y The orthographic projection of the second scanning connection line 301 on the base substrate is located between the orthographic projection of the control electrode T23 of the second transistor T2 on the base substrate and the orthographic projections of the second electrode C1-2 of the first storage capacitor C1 on the base substrate in the second direction Y The orthographic projection of the second electrode C1-2 of the first storage capacitor C1 on the base substrate partially overlaps the orthographic projection of the first electrode C1-1 on the base substrate. For example, the orthographic projection of the second electrode C1-2 of the first storage capacitor C1 on the base substrate may be L-shaped. However, this embodiment does not limit this.

Figure 10D:
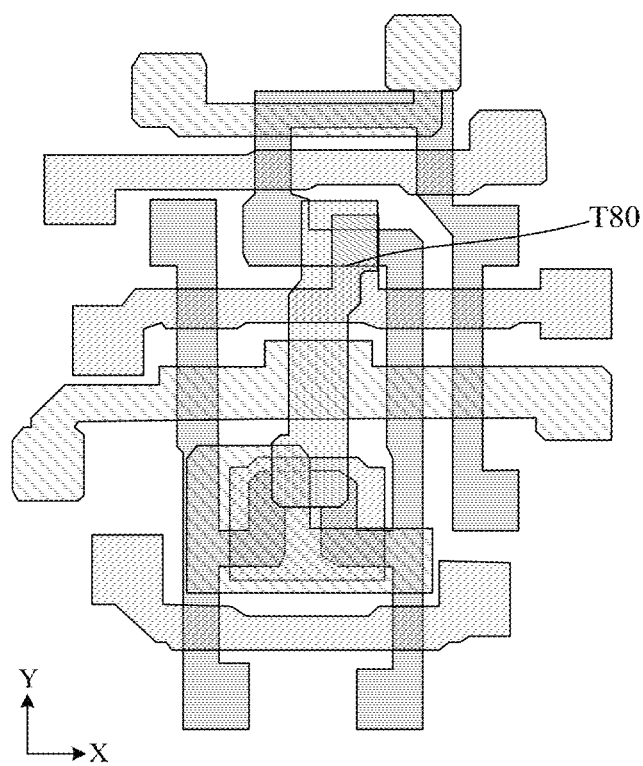

FIG. 10D is a partial plan view of the second display area after forming the second semiconductor layer according to at least one embodiment of the present disclosure. In some exemplary embodiments, as shown in FIG. 10D, the second semiconductor layer of the second display area may include: an active layer of the second-type transistor of the second pixel circuit, for example, an active layer T80 of the eighth transistor T8. The active layer T80 of the eighth transistor T8 extends along the second direction Y The orthographic projection of the active layer T80 of the eighth transistor T8 on the base substrate overlaps the orthographic projection of the second scan connection line 301 on the base substrate. In the present exemplary embodiment, the material of the second semiconductor layer may include a metal oxide, such as Indium Gallium Zinc Oxide (IGZO).

Figure 10E:
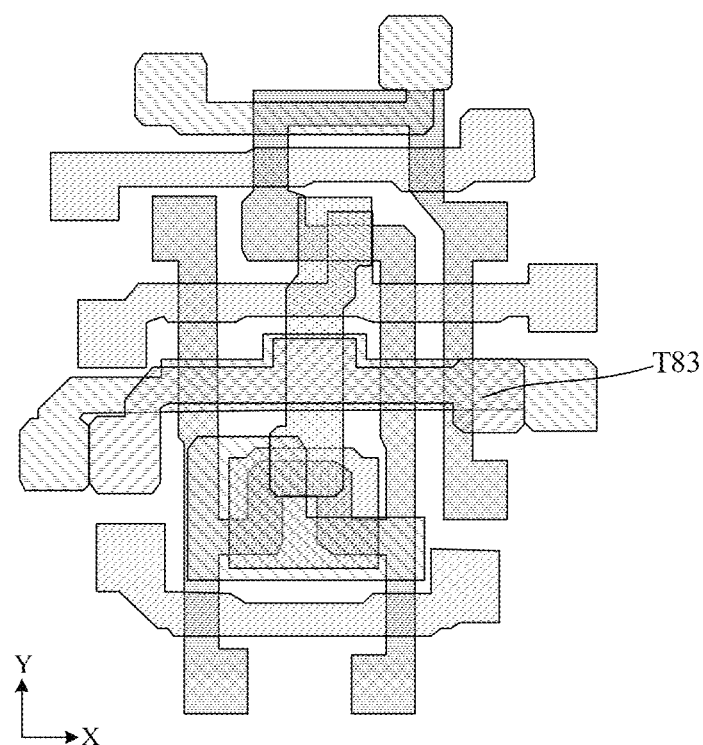

FIG. 10E is a partial plan view of the second display area after forming the third conductive layer according to at least one embodiment of the present disclosure. In some exemplary embodiments, as shown in FIG. 10E, the third conductive layer of the second display area may include: the control electrode of the second-type transistor of the second pixel circuit, e.g., the control electrode T83 of the eighth transistor T8. The control electrode T83 of the eighth transistor T8 extends along the first direction X. The orthographic projection of the control electrode T83 of the eighth transistor T8 on the base substrate overlaps the orthographic projection of the active layer T80 of the eighth transistor T8 on the base substrate. There are overlapping areas among the orthographic projections of the second scan connection line 301, the active layer T80 of the eighth transistor T8 and the control electrode T83 of the eighth transistor T8 on the base substrate. In this example, the second scan connection line 301 may serve as the bottom gate of the eighth transistor T8, thereby forming the eighth transistor T8 with a double gate structure. However, this embodiment does not limit this.

Figure 10F:
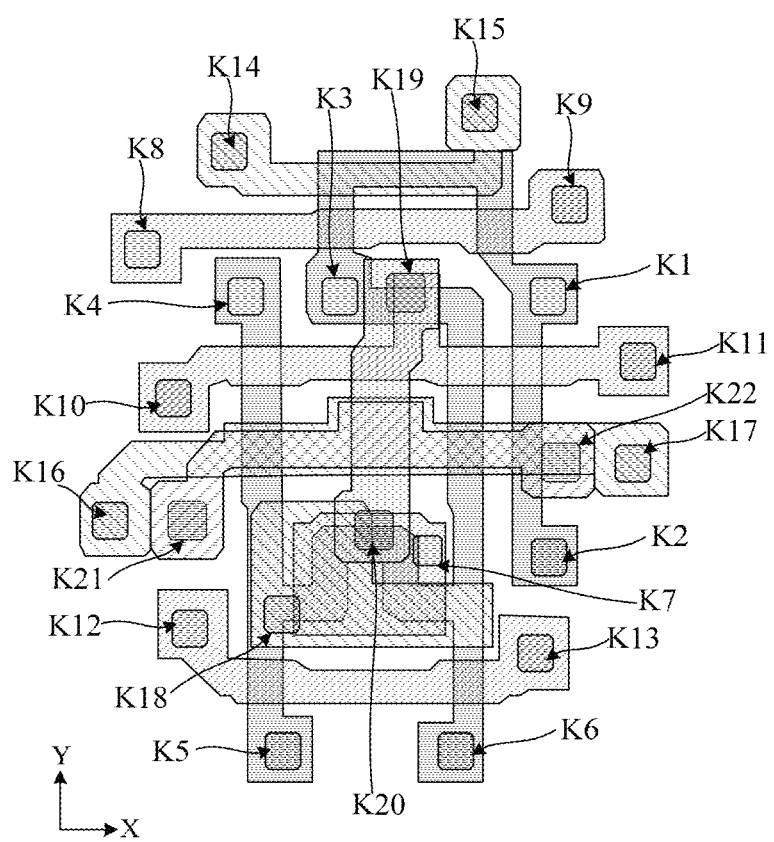

FIG. 10F is a partial plan view of the second display area after forming the fifth insulating layer according to at least one embodiment of the present disclosure. In some exemplary embodiments, as shown in FIG. 10F, a plurality of via holes are formed in the fifth insulating layer of the second display area, and the plurality of via holes may at least include: the first via hole K1 to the twenty-second via hole K22. The fifth insulating layer, the fourth insulating layer, the third insulating layer, the second insulating layer and the first insulating layer in the first via hole K1 to the sixth via hole K6 are etched away, to expose the surface of the first semiconductor layer. The fifth insulating layer, the fourth insulating layer, the third insulating layer and the second insulating layer in the seventh via hole K7 to the thirteenth via hole K13 are etched away to expose the surface of the first conductive layer. The fifth insulating layer, the fourth insulating layer and the third insulating layer in the fourteenth via hole K14 to the eighteenth via hole K18 are etched away to expose the surface of the second conductive layer. The fifth insulating layer and the fourth insulating layer in the nineteenth via hole K19 and the twentieth via hole K20 are etched away to expose the surface of the second semiconductor layer. The fifth insulating layer in the twenty-first via hole K21 and the twenty-second via hole K22 is etched away to expose the surface of the third conductive layer.

Figure 10G:
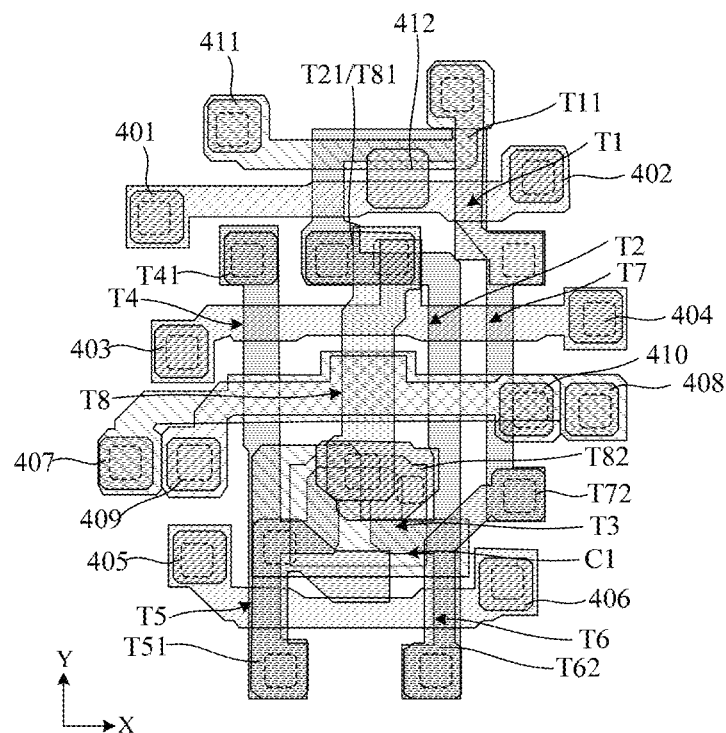

FIG. 10G is a partial schematic plan view of the second display area after forming the fourth conductive layer according to at least one embodiment of the present disclosure. In some exemplary embodiments, as shown in FIG. 10G, the fourth conductive layer of the second display area may include: first and second electrodes of a plurality of transistors of the second pixel circuit (e.g., the first electrode T11 of the first transistor T1, the first electrode T21 of the second transistor T2, the first electrode T41 of the fourth transistor T4, the first electrode T51 of the fifth transistor T5, the second electrode T62 of the sixth transistor T6, the second electrode T72 of the seventh transistor T7, the first electrode T81 of the eighth transistor T8 and the second electrode T82 of the eighth transistor T8), a plurality of connection electrodes (e.g., the first connection electrode 401, the second connection electrode 402, the third connection electrode 403, the fourth connection electrode 404, the fifth connection electrode 405, the sixth connection electrode 406, the seventh connection electrode 407, the eighth connection electrode 408, the ninth connection electrode 409, the tenth connection electrode 410, the eleventh connection electrode 411 and the twelfth connection electrode 412).

In some exemplary embodiments, as shown in FIG. 10G, the second electrode T62 of the sixth transistor T6 and the second electrode T72 of the seventh transistor T7 may have an integrated structure. The first electrode T21 of the second transistor T2 and the first electrode T81 of the eighth transistor T8 may have an integrated structure. However, this embodiment does not limit this.

In some exemplary embodiments, as shown in FIG. 10G, the first electrode T11 of the first transistor T1 is electrically connected to the initial connection line 302 through the fifteenth via hole K15, and is also electrically connected to the first doped area of the active layer T10 of the first transistor T1 through the first via hole K1. The first electrode T41 of the fourth transistor T4 is electrically connected to the first doped area of the active layer T40 of the fourth transistor T4 through the fourth via hole K4. The first electrode T51 of the fifth transistor T5 is electrically connected to the first doped area of the active layer T50 of the fifth transistor T5 through the fifth via hole K5, and is also electrically connected to the second electrode C1-2 of the first storage capacitor C1 through the eighteenth via hole K18. The second electrode T62 of the sixth transistor T6 is electrically connected to the second doped area of the active layer T60 of the sixth transistor T6 through the sixth via hole K6. The second electrode T72 of the seventh transistor T7 is electrically connected to the second doped area of the active layer T70 of the seventh transistor T7 through the second via hole K2. The first electrode T21 of the second transistor T2 is electrically connected to the first doped area of the active layer T20 of the second transistor T2 through the third via hole K3. The first electrode T81 of the eighth transistor T8 is electrically connected to the first doped area of the active layer T80 of the eighth transistor T8 through the nineteenth via hole K19. The second electrode T82 of the eighth transistor T8 is electrically connected to the second doped area of the active layer T80 of the eighth transistor T8 through the twentieth via hole K20, and is also electrically connected to the second electrode C1-1 of the first storage capacitor C1 through the seventh via hole K7.

In some exemplary embodiments, as shown in FIG. 10G, the first connection electrode 401 is electrically connected to one end of the reset connection line 201 through the eighth via hole K8, and the second connection electrode 402 is electrically connected to another end of the reset connection line 201 through the ninth via hole K9. The third connection electrode 403 is electrically connected to one end of the first scan connection line 202 through the tenth via hole K10, and the fourth connection electrode 404 is electrically connected to the other end of the first scan connection line 202 through the eleventh via hole K11. The fifth connection electrode 405 is electrically connected to one end of the light emitting connection line 203 through the twelfth via hole K12, and the sixth connection electrode 406 is electrically connected to the other end of the light emitting connection line 203 through the thirteenth via hole K13. The seventh connection electrode 407 is electrically connected to one end of the second scan connection line 301 through the sixteenth via hole K16, and the eighth connection electrode 408 is electrically connected to the other end of the second scan connection line 301 through the seventeenth via hole K17. The ninth connection electrode 409 is electrically connected to one end of the control electrode T83 of the eighth transistor T8 through the twenty-first via hole K21, and the tenth connection electrode 410 is electrically connected to the other end of the control electrode T83 of the eighth transistor T8 through the twenty-second via hole K22. The seventh connection electrode 407 is adjacent to the ninth connection electrode 409, and the eighth connection electrode 408 is adjacent to the tenth connection electrode 410. The eleventh connection electrode 411 is electrically connected to one end of the initial connection line 302 through the fourteenth via hole K14. The orthographic projection of the twelfth connection electrode 412 on the base substrate overlaps the orthographic projection of the initial connection line 302 and the reset connection line 201 on the base substrate, and does not overlap the orthographic projection of the first semiconductor layer on the base substrate. However, this embodiment does not limit this.

Figure 10H:
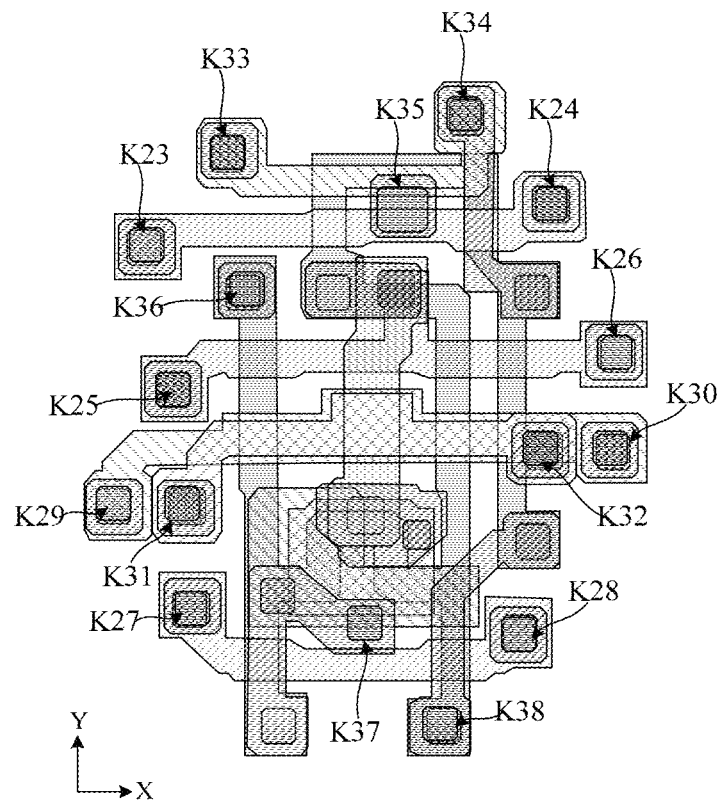

FIG. 10H is a partial schematic plan view of the second display area after forming the sixth insulating layer according to at least one embodiment of the present disclosure. In some exemplary embodiments, as shown in FIG. 10H, a plurality of via holes are formed in the sixth insulating layer in the second display area, and the plurality of via holes may at least include: twenty-third via hole K23 to thirty-eighth via hole K38. The sixth insulating layer in the twenty-third via hole K23 to the thirty-eighth via hole K38 is etched away, to expose the surface of the fourth conductive layer.

The plurality of sub-signal lines of the second display area 12 and the electrodes of the second pixel circuit are respectively connected through the twenty-third via hole K23 to the thirty-eighth via hole K38. Optionally, the plurality of sub-signal lines include: initialization signal sub-lines, reset control sub-lines, scan sub-lines, light emitting control sub-lines, power supply sub-lines, and the like. As shown in FIG. 7, in the embodiment of the present disclosure, the second part 320 of the second initialization signal line 320 is formed as the initialization signal sub-line arranged on the second display area 12, and is connected to one initialization signal sub-line through the thirty-third via hole K33 in FIG. 10H, connected to another initialization signal sub-line through the thirty-fourth via hole K34 in FIG. 10H, and the two parts of initialization signal sub-lines are connected through the initial connection line 302 to form the second part of the second initialization signal line 320.

In the display panel according to the embodiment of the present disclosure, the plurality of second pixel circuits in the second display area adopt the above-mentioned structure, and the second initialization signal line on the display panel is connected to the second pixel circuits in the second display area, and the first initialization signal line is connected to the first pixel circuit in the first display area to ensure that the pixel circuit set in the normal display area and the pixel circuit set in the display area corresponding to the under-screen camera module are connected to different initialization signal lines respectively, and different initialization signal lines are used to reset the pixel circuit, which can ensure the display uniformity of different areas and ensure the high-resolution display effect of the entire display area of the display panel.

Another aspect of the embodiments of the present disclosure further provides a display device, the display device including the display panel of any of the above implementation.

It should be noted that, according to FIG. 1 to FIG. 10H, those skilled in the art can understand the specific implementation structure of the display device using the display panel according to the embodiment of the present disclosure, which will not be described in detail here.

In addition, in the embodiment of the present disclosure, optionally, the display device further includes a first voltage source and a second voltage source, wherein each of the first initialization signal lines is connected to the first voltage source, and the first voltage source provides a first initial voltage to each of the first initialization signal lines, each of the second initialization signal lines is connected to the second voltage source, and the second voltage source provides a second initial voltage to each of the second initializing signal lines; the second initial voltage is different from the first initial voltage.

Another aspect of the embodiments of the present disclosure further provides a display driving method for the display device as described above, wherein the method includes:

Inputting, when the display panel displays an image, a first initial voltage signal to a plurality of first initializing signal lines, and a second initial voltage signal to a plurality of second initializing signal lines, so that the plurality of first pixel circuits and the plurality of second pixel circuits are capable of emitting light;

Wherein, the first initial voltage is different from the second initial voltage.

Optionally, the second initial voltage is smaller than the first initial voltage.

With this embodiment, the initial voltage inputted by the second pixel circuit in the second display area is smaller than the initial voltage inputted by the first pixel circuit in the first display area, the turn-on level of the driving transistor of the pixel circuit in the second display area is improved, so as to improve the display brightness of the second display area and reduce the display difference with the first display area.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a base substrate, wherein the base substrate comprises a display area and a peripheral area at least partially surrounding the display area, the display area comprises a first display area and a second display area, the first display area at least partially surrounds the second display area;
   a plurality of first pixel circuits located in the first display area;
   a plurality of second pixel circuits located in the second display area;
   a plurality of first initialization signal lines, located at least in the first display area and extending in a first direction, the first initialization signal lines being electrically connected to the first pixel circuit and configured to transmit a first initial voltage signal to the first pixel circuit;
   a plurality of second initialization signal lines, located at least in the first display area and the second display area, and electrically connected to the second pixel circuit, configured to transmit a second initial voltage signal to the second pixel circuit; the first initial voltage signal and the second initial voltage signal being different;
   wherein a voltage of the first initial voltage signal is higher than a voltage of the second initial voltage signal.

2. The display panel according to claim 1, wherein the second initialization signal line comprises a first part located in the first display area and a second part located in the second display area, the second part is connected to the second pixel circuit.

3. The display panel according to claim 1, wherein the display panel further comprises a third initialization signal line; the third initialization signal line at least partially surrounds the second pixel circuit, and the plurality of first initialization signal lines is connected to the third initialization signal line.

4. The display panel according to claim 3, wherein the third initialization signal line and a first part of the second initialization signal line located in the first display area are arranged at a same layer, and the plurality of first initialization signal lines and a second part of the second initialization signal line located in the second display area are arranged at a same layer, the first part and the second part are electrically connected to each other and arranged at different layers.

5. The display panel according to claim 3, wherein the third initialization signal line is located in the first display area or the second display area, and the third initialization signal line is in a closed ring shape.

6. The display panel according to claim 1, wherein the display panel further comprises a first initialization bus and a second initialization bus located in the peripheral area, the plurality of first initialization signal lines is connected to the first initialization bus, and the plurality of second initialization signal lines is connected to the second initialization bus.

7. The display panel according to claim 6, wherein the first initialization bus is located on a side of the second initialization bus away from the base substrate.

8. The display panel according to claim 6, wherein the first initialization bus comprises a first sub-line and a second sub-line; the first sub-line and the second sub-line are located on both sides of the display area;
   the second initialization bus includes a third sub-line and a fourth sub-line, and the third sub-line and the fourth sub-line are located on both sides of the display area.

9. The display panel according to claim 1, wherein the plurality of first pixel circuits comprises a plurality of first pixel groups, and the plurality of second pixel circuits comprises a plurality of second pixel groups;
   different first pixel groups are connected to different first initialization signal lines in the first display area; different second pixel groups are connected to different second initialization signal lines in the second display area.

10. The display panel according to claim 9, wherein a plurality of first pixel circuits located in a same first pixel group is sequentially arranged in a straight line along the first direction; a plurality of second pixel circuits located in a same second pixel group is staggered along a second direction.

11. The display panel according to claim 1, wherein, in the first display area, at least part of the plurality of first initialization signal lines and at least part of the plurality of second initialization signal lines are alternately arranged along a second direction; the second direction intersects the first direction.

12. The display panel according to claim 4, wherein the plurality of the first pixel circuits and the plurality of the second pixel circuits respectively comprise thin film transistors arranged on the base substrate, the thin film transistor comprises an active layer, a gate electrode and a source/drain electrode that are sequentially arranged in a direction away from the base substrate;
   the display panel further includes a light shielding layer arranged between the base substrate and the active layer;
   wherein, the plurality of first initialization signal lines, the second part and the gate electrode are arranged at a same layer and made of a same material;
   the third initialization signal line, the first part, and the active layer are arranged at a same layer and made of a same material; or, the third initialization signal line, the first part, and the light shielding layer are arranged at a same layer and made of a same material; or, the third initialization signal line, the first part and the source-drain layer are arranged at a same layer and made of a same material.

13. The display panel according to claim 12, wherein the first part and the second part are electrically connected through a first connection layer, and the plurality of first initialization signal lines and the third initialization signal line are electrically connected through a second connection layer;
   the first connection layer and the second connection layer are arranged at a same layer and made of a same material.

14. The display panel according to claim 13, wherein the first connection layer, the second connection layer and the source/drain electrodes are arranged at a same layer and made of a same material.

15. The display panel according to claim 12, wherein the plurality of first initialization signal lines and the plurality of second initialization signal lines are respectively electrically connected to source/drain electrodes of thin film transistors.

16. The display panel according to claim 1, wherein the second display area is a light transmitting display area, and a density of the plurality of second pixel circuits in the second display area is less than or equal to a density of the plurality of first pixel circuits in the first display area.

17. The display panel according to claim 1, wherein the display area further comprises a plurality of auxiliary signal lines located in the first display area and extending along the first direction;
  the plurality of auxiliary signal lines is not connected to any one of the first pixel circuits and any one of the second pixel circuits.

18. The display panel according to claim 17, wherein the auxiliary signal line and a part of the second initialization signal line are arranged at a same layer and made of a same material.

19. A display device, comprising the display panel according to claim 1.

* * * * *